(12) United States Patent
Yeh et al.

(10) Patent No.: US 6,458,642 B1
(45) Date of Patent: Oct. 1, 2002

(54) METHOD OF FABRICATING A SONOS DEVICE

(75) Inventors: Yen-hung Yeh, Taoyuan Hsien; Tso-Hung Fan, Taipei Hsien; Mu Yi Liu, Taichung; Kwang Yang Chan, Hsinchu; Tao-Cheng Lu, Kaoshiung, all of (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/990,159

(22) Filed: Nov. 20, 2001

(30) Foreign Application Priority Data

Oct. 29, 2001 (TW) ........................................ 90126670 A

(51) Int. Cl.$^7$ .......................................... H01L 21/8238
(52) U.S. Cl. ...................... 438/216; 438/261; 438/591; 438/954
(58) Field of Search ................................ 438/216, 261, 438/591, 258, 954

(56) References Cited

U.S. PATENT DOCUMENTS

| | | | | | |
|---|---|---|---|---|---|
| 5,371,030 A | * | 12/1994 | Bergemont | ................. | 438/261 |
| 5,656,837 A | * | 8/1997 | Lancaster et al. | ........... | 257/314 |
| 5,966,603 A | * | 10/1999 | Eitan | ........................ | 438/258 |
| 6,037,228 A | * | 3/2000 | Hsu | ........................... | 438/279 |
| 6,063,666 A | * | 5/2000 | Chang et al. | ................ | 438/261 |
| 6,077,763 A | * | 6/2000 | Chen et al. | ................. | 438/595 |
| 6,162,684 A | * | 12/2000 | Chang et al. | ................ | 438/261 |
| 6,297,143 B1 | * | 10/2001 | Foote et al. | ................ | 438/618 |
| 6,303,959 B1 | * | 10/2001 | Ratnam | ..................... | 257/314 |
| 6,348,381 B1 | * | 2/2002 | Jong et al. | .................. | 438/261 |
| 6,376,308 B1 | * | 4/2002 | Wang et al. | ................ | 438/261 |
| 2002/0045319 A1 | * | 4/2002 | Ogura et al. | ................ | 438/303 |

FOREIGN PATENT DOCUMENTS

EP        1073120 A2 * 1/2001     ......... H01L/27/115

* cited by examiner

*Primary Examiner*—Olik Chaudhuri
*Assistant Examiner*—David S Blum
(74) *Attorney, Agent, or Firm*—J.C. Patents

(57) ABSTRACT

A method of fabricating a SONOS device, in which a first silicon oxide layer, a trapping layer, and a second silicon oxide layer are formed on the substrate. Then, a mask pattern is formed over the substrate to serve as a mask in the implantation process for forming the buried bit-lines. Afterward, a portion of the mask pattern is removed to increase the gap size of the mask pattern, then a pocket ion implantation is performed to form a pocket doped region at the periphery of the buried bit-line by using the mask pattern as a mask. Subsequently, the mask pattern is removed and a thermal process is conducted using the trapping layer as a mask to form a buried bit-line oxide layer. A word-line is subsequently formed over the substrate.

10 Claims, 6 Drawing Sheets

METHOD OF FABRICATING A SONOS DEVICE

CROSS-REFERENCE TO RELATED APPLICATION

This application claims the priority benefit of Taiwan application serial no. 90126670, filed Oct. 29, 2001.

BACKGROUND OF THE INVENTION

1. Field of Invention

This invention relates to a semiconductor process, particularly to a method of fabricating a SONOS (Substrate/Oxide/Nitride/Oxide/Silicon) device.

2. Description of Related Art

FIG. 1 illustrates a cross sectional view of a conventional SONOS device.

Refer to FIG. 1, a word-line 104 is disposed on a substrate 100 and an ONO (Oxide/Nitride/Oxide) composite layer 102 is located between the word-line 104 and the substrate 100 to act as a trapping layer. Buried bit-lines 106 are disposed in the substrate 100 beside the ONO layer 102, while buried bit-line oxide layers 108 are located on the buried bit-lines 106 to separate the buried bit-lines 106 and the word-lines 104.

However, the dopants in the buried bit-lines 106 that are normally formed by ion implantation easily diffuse during the thermal process. The effective channel length of the device is thus decreased and the short channel effect is consequently induced. The short channel effect becomes even more severe when the device is scaled down.

Therefore, another method of making a SONOS device is provided to solve the above-mentioned problems, wherein a pocket doped region is used as an isolation for the buried bit-line 106.

FIGS. 2A~2C are cross sectional views illustrating the process flow of fabricating a SONOS device in the prior art.

Refer to FIG. 2A, an ONO composite layer 202 is first formed on a substrate 200, then a mask pattern 210 is formed on the ONO layer 202. A pocket ion implantation 212 is then performed to form doped pocket regions 214 in the substrate 200 beside the ONO layer 202 by using the mask pattern 210 as a mask. The pocket ion implantation 212 must be performed in large angle, so as to enable the pocket doped region 214 to reach under the side-wall of the ONO layer 202.

Refer to FIG. 2B, another ion implantation 216 is conducted to form buried bit-lines 206 in the substrate 200 beside the ONO layer 202 by using the mask pattern 210 as a mask.

Refer to FIG. 2C, the mask pattern 210 is removed, then a thermal process is conducted to form the buried bit-line oxide layers 218 on the buried bit-lines 206 by using the ONO layer 202 as a mask. Finally, a word-line 204 is formed over the substrate 200.

However, since the buried bit-lines 206 and the pocket doped regions 214 are formed with the same ONO layer 202 as their implantation masks, the pocket ion implantation 212 must be conducted in large angle, thus the implantation process is more complicated and less reliable. In addition, the pocket doped regions 214 such formed cannot well cover the buried bit-line 206. The punch-through phenomenon thereby easily occurs.

SUMMARY OF THE INVENTION

Accordingly, a method of fabricating a SONOS is provided in this invention to prevent the short channel effect caused by diffusion of the dopants in the buried bit-lines during the thermal process.

The invention also provides a method of fabricating a SONOS device, wherein the pocket doped region is formed at the periphery of the buried bit-line and well covers the buried bit-line to avoid the punch-through phenomenon.

According to a preferred embodiment of the present invention provides of fabricating a SONOS device, a first silicon oxide layer, a trapping layer, and a second silicon oxide layer are sequentially formed on the substrate. A mask pattern is formed on the second silicon oxide layer to serve as a mask in the following implantation process for forming the buried bit-lines. Afterward, a portion of the mask pattern, the second oxide layer and the trapping layer exposed by the mask pattern are removed by, for example, isotropic etching back to increase the gap size of the mask pattern and expose a portion of the first oxide layer. A pocket ion implantation is then performed to form a pocket doped region at the periphery of the buried bit-line by using the mask pattern as a mask. Subsequently, the mask pattern is removed and a thermal process is conducted using the trapping layer as a mask to form a buried bit-line oxide layer, then a word-line is formed over the substrate.

This invention also provides a method of fabricating a NROM (Nitride ROM) device. A first oxide layer, a trapping layer, and a second oxide layer are sequentially formed on the substrate. A gate pattern is formed on the second oxide layer to serve as a mask in the following implantation process for forming the buried bit-lines. Afterward, a portion of the gate pattern, the second oxide layer and the trapping layer exposed by the gate pattern are removed by, for example, isotropic etching back to increase the gap size of the gate pattern and expose a portion of the first oxide layer. A pocket ion implantation is then performed to form a pocket doped region at the periphery of the buried bit-line by using the gate pattern as a mask. Subsequently, a thermal process is conducted by using the trapping layer as a mask to form a buried bit-line oxide layer on the buried bit-line, then a word-line is formed over the substrate.

According to the present invention, a mask pattern with a smaller gap size is used as the implantation mask for making the buried bit-line and then the mask pattern is isotropically etched to serve as a mask in the pocket ion implantation process. Since the buried bit-line is formed with the mask pattern having a smaller gap size, the short channel effect caused by diffusion of the dopants in the buried bit-line can be prevented and the effective channel length is increased. Meanwhile, the gap size of the mask pattern is increased by an isotropic etching-back process. The pocket doped region can thereby be formed at the periphery of the buried bit-line to avoid the punch-through phenomenon.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The method of fabricating a SONOS device according to the first embodiment of this invention is described in the following paragraphs.

FIGS. 3A~3E are cross sectional views illustrating the process flow of fabricating a SONOS device according to the first embodiment of this invention.

Figure 1:
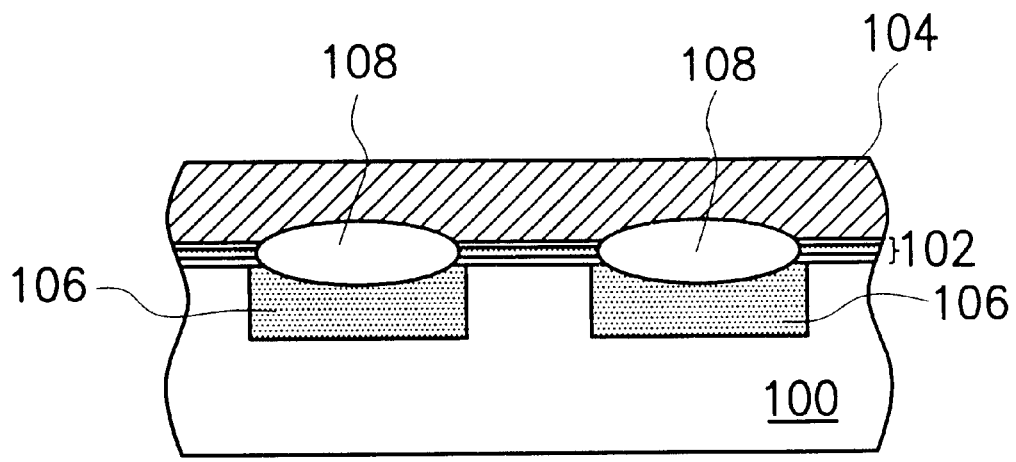
FIG. 1 illustrates a cross sectional view of a conventional SONOS device.
Figure 2A:
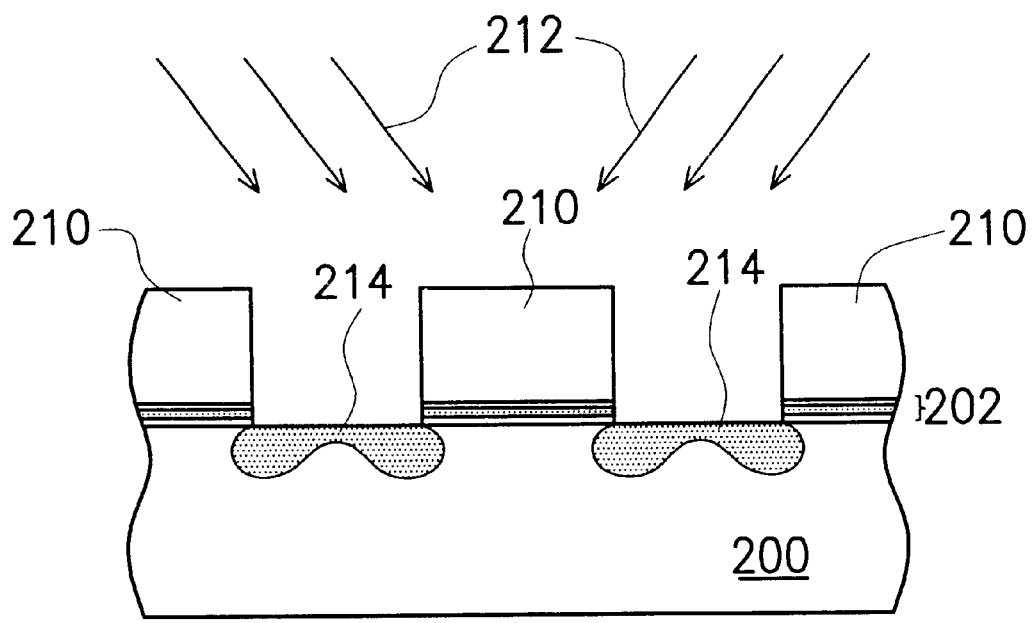
FIGS. 2A~2C are cross sectional views illustrating the process flow of fabricating a SONOS device in the prior art.
Figure 2B:
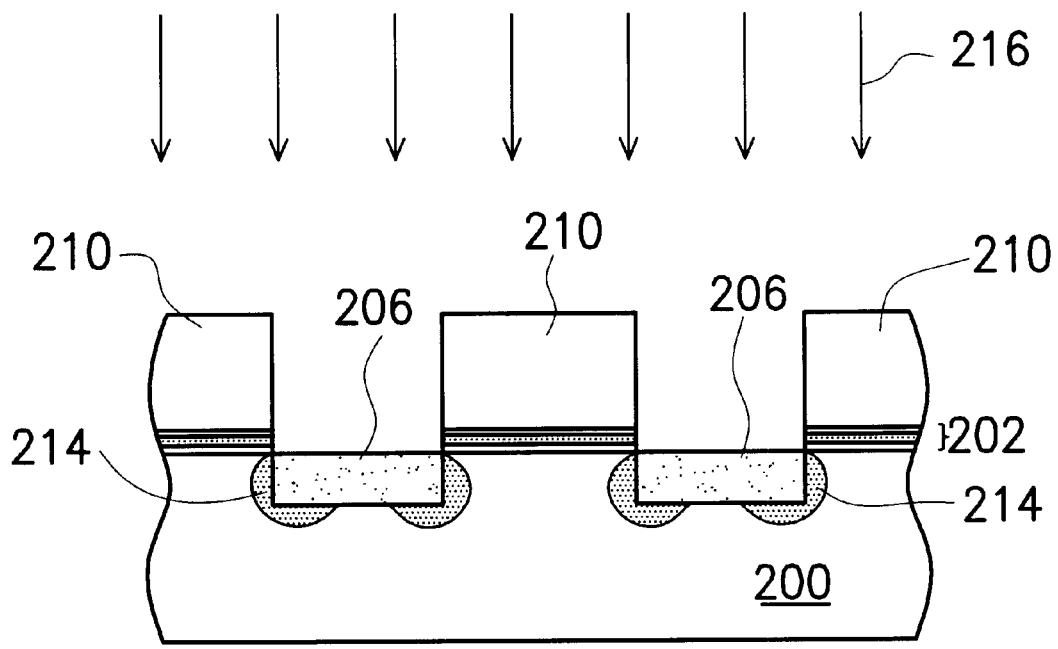
Figure 2C:
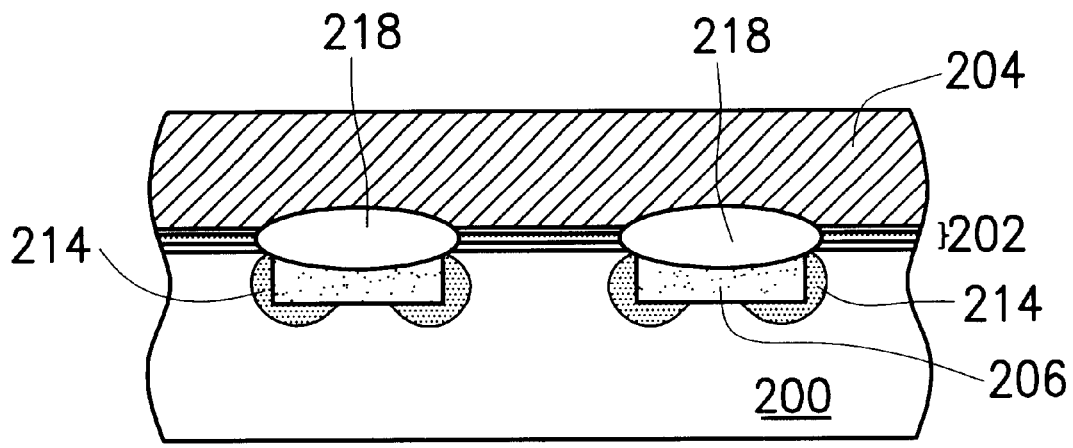
Figure 3A:
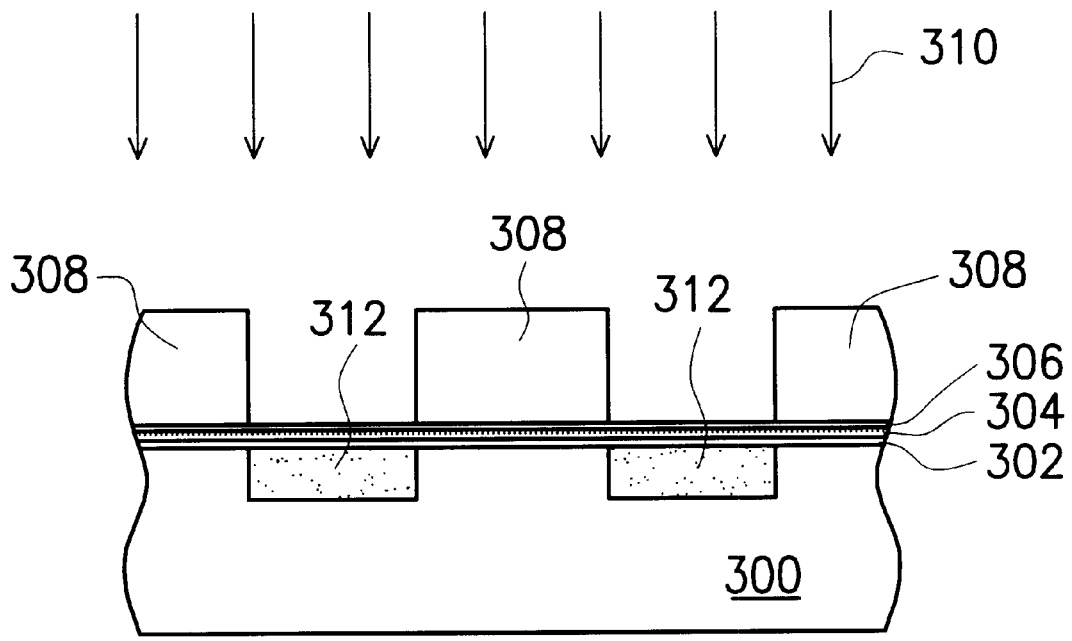
FIGS. 3A~3E are cross sectional views illustrating the process flow of fabricating a SONOS device according to the first embodiment of this invention.

Refer to FIG. 3A, a first silicon oxide layer 302, a trapping layer 304, and a second silicon oxide layer 306 are sequentially formed on a substrate 300, wherein the trapping layer 304 comprises silicon nitride. The first (or second) silicon oxide 302 (or 306) serves to enhance the adhesion forces between the trapping layer 304 and the substrate 300 (or the mask pattern 308 formed later) and to reduce the defects. Afterward, a mask pattern 308 comprising, for example, silicon nitride is formed on the second silicon oxide layer 306, then an ion implantation 310 is performed to fabricate the buried bit-lines 312 in the substrate 300 by using the mask pattern 308 as a mask.

Figure 3B:
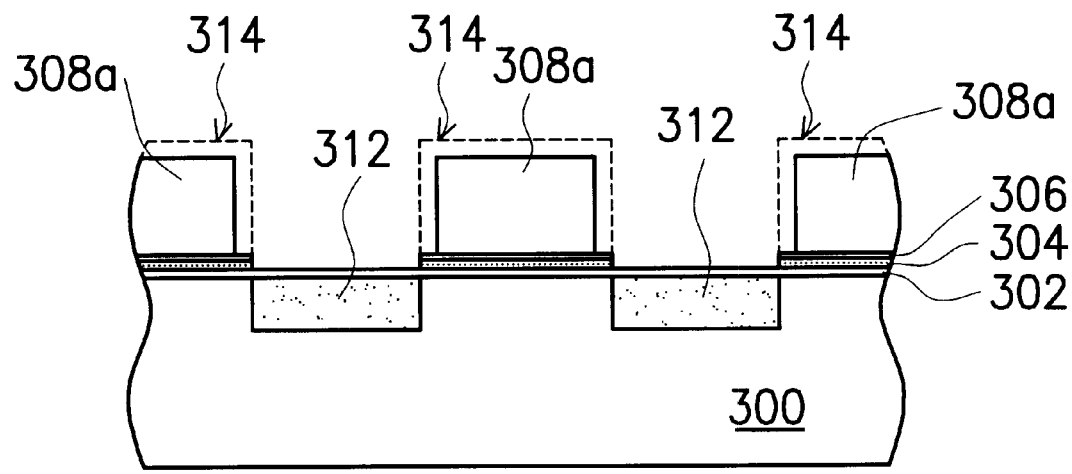

Refer to FIG. 3B, the second silicon oxide layer 306 and the trapping layer 304 exposed by the mask pattern 308 are removed, then a portion of the mask pattern 308 is removed by, for example, isotropic etching-back. Thus, a portion of the first silicon oxide layer 302 is exposed and the gap size of the mask pattern 308 is increased, while the label of the mask pattern becomes 308a hereafter.

Figure 3C:
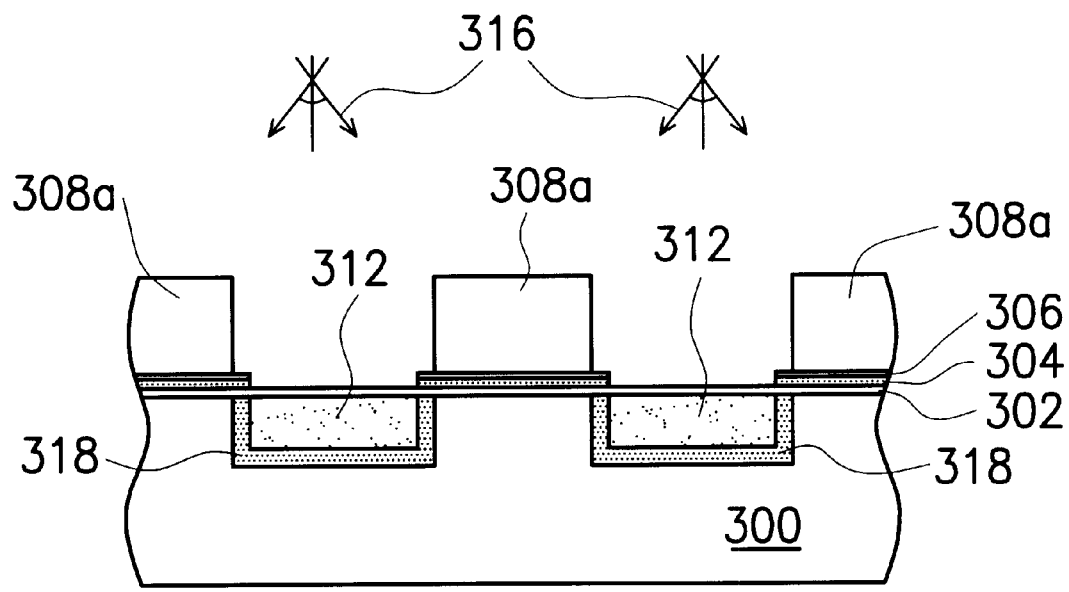

Refer to FIG. 3C, a pocket ion implantation 316 is then performed to form a pocket doped region 318 at the periphery of the buried bit-line 312 by using the mask pattern 308a as a mask. Since the pocket doped region 318 such formed entirely covers the buried bit-line 312, the punch-through phenomenon can be avoided.

Figure 3D:
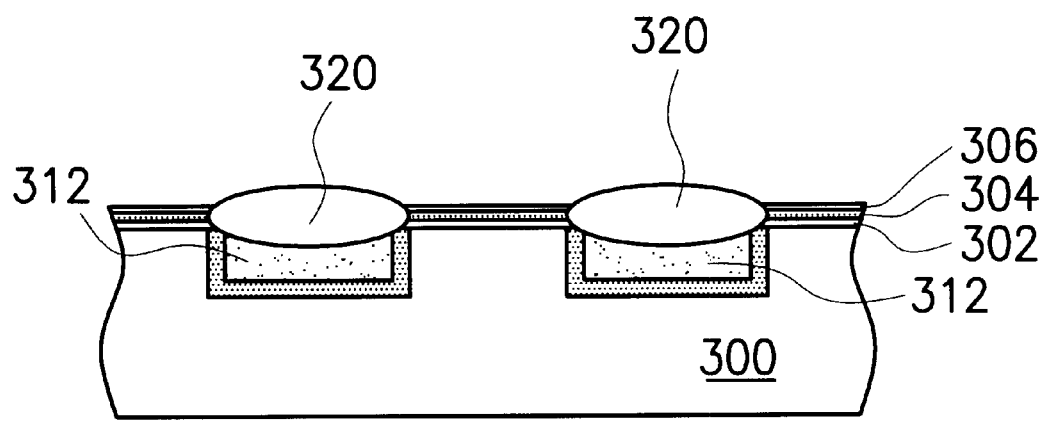

Refer to FIG. 3D, the mask pattern 308a is removed, then a thermal process is conducted to form the buried bit-line oxide layer 320 on the buried bit-line 312 by using the trapping layer 304 as a mask.

Figure 3E:
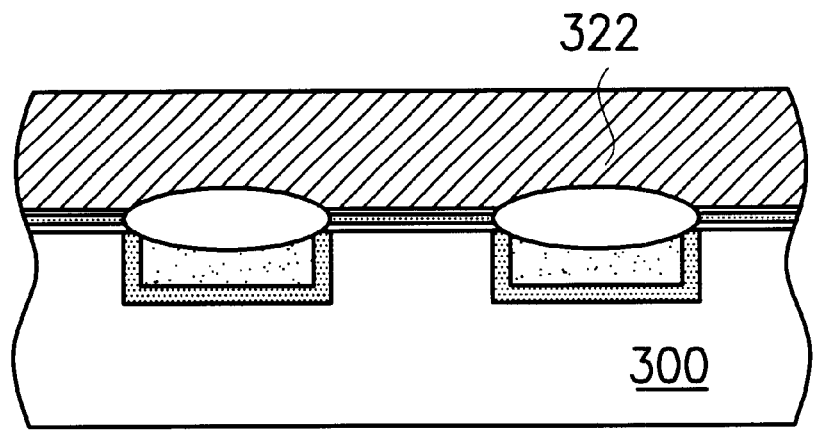

Refer to FIG. 3E, a word-line 222 comprising polysilicon is then formed over the substrate 300.

Figure 4:
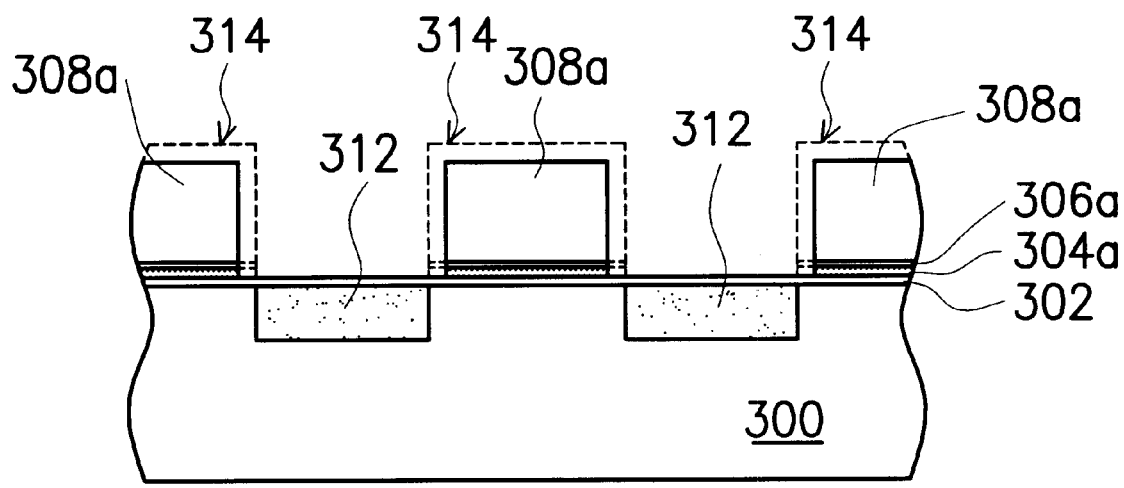
FIG. 4 is a cross sectional view showing that a portion of the mask pattern, the edges of the second silicon oxide layer and the trapping layer are removed according to the first embodiment of this invention.

Besides, except for the case shown in FIG. 3B, in this embodiment the step of removing a portion of the mask pattern 308 may result in the situation shown in FIG. 4.

FIG. 4 is a cross sectional view showing that a portion of the mask pattern, the second oxide layer and the trapping layer exposed by the mask pattern are removed according to the first embodiment of this invention.

Refer to FIG. 4, the second silicon oxide layer 306 and the trapping layer 304 exposed by the mask pattern 308 have been removed previously. As shown in FIG. 4, when the mask pattern 308 is being isotropically etched back to the mask pattern 308a with a larger gap size, it is possible to remove the exposed edges of the second silicon oxide layer 306 and the trapping layer 304 simultaneously to form 306a and 304a under 308a, respectively.

Moreover, the method provided in this invention can also be applied to fabricate a NROM device according to the second embodiment of this invention.

The early steps of this NROM process are the same as those shown in FIGS. 3A~3C. The mask pattern in the second embodiment, however, is replaced by a gate pattern 324 comprising a material such as polysilicon, while the latter steps can be seen from FIG. 5.

Figure 5:
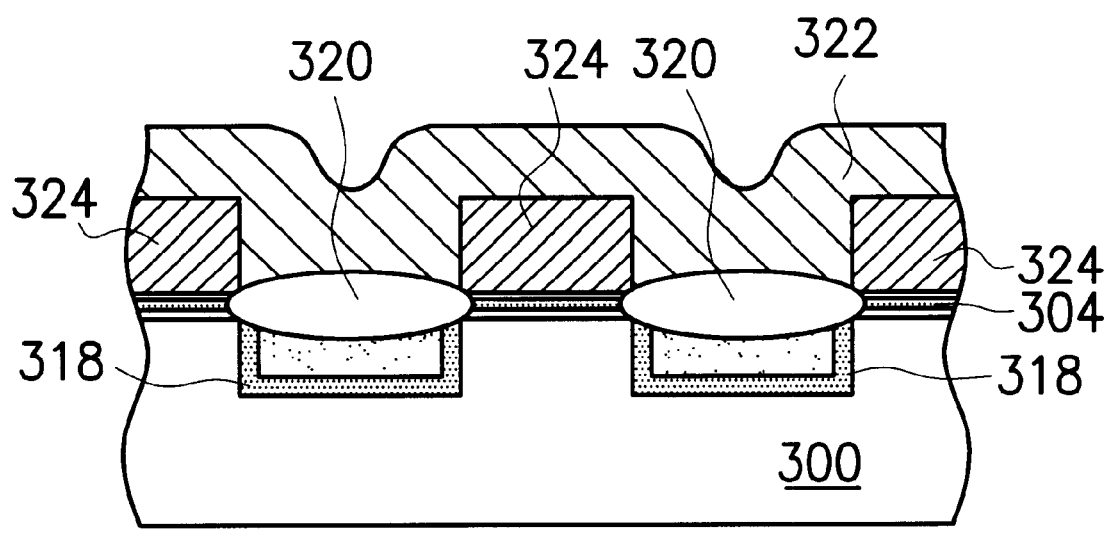
FIG. 5 is a cross sectional view of the NROM device obtained from the method provided in the second embodiment of this invention.

FIG. 5 is a cross sectional view of the NROM device obtained from the method provided in the second embodiment of this invention, while the steps after forming the pocket doped regions 318 can also be seen from FIG. 5.

Refer to FIG. 5, a thermal process is conducted to form the buried bit-line oxide layers 320 on the buried bit-lines 312 by using the trapping layer 304 as a mask. A word-line 322 comprising polysilicon is then formed on the substrate 300.

According to the fabrication method for a SONOS or a NROM, the short channel effect caused by the dopant diffusion from the buried bit-line can be prevented since the effective channel length can be increased by using a mask pattern with a smaller gap size as the implantation mask for making the buried bit-line. In another word, the device can be scaled down more easily with this method.

Moreover, the punch-through phenomenon can be prevented since the pocket doped region is formed at the periphery of the buried bit-line and covers the periphery of the buried bit-line completely by using the mask pattern with an increased gap size as an implantation mask.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method of fabricating a SONOS (substrate/oxide/nitride/oxide/silicon) device, comprising the steps of:

forming a first silicon oxide layer, a trapping layer, and a second silicon oxide layer on a substrate;

forming a mask pattern on the second silicon oxide layer;

performing an ion implantation process to form a buried bit-line in the substrate by using the mask pattern as a mask;

removing a portion of the mask pattern, the second silicon oxide layer and the trapping layer exposed by the mask pattern to increase a gap size of the mask pattern and to expose a portion of the first silicon oxide layer;

performing a pocket ion implantation process to form a pocket doped region at the periphery of the buried bit-line by using the mask pattern as a mask;

removing the mask pattern;

conducting a thermal process to form a buried bit-line oxide layer on the buried bit-line by using the trapping layer as a mask; and forming a word-line over the substrate.

2. The method of claim 1, wherein removing the portion of the mask pattern comprises isotropic etching-back.

3. The method of claim 1, wherein the trapping layer comprises silicon nitride.

4. The method of claim 1, wherein the mask pattern comprises silicon nitride.

5. The method of claim 1, wherein the word-line comprises polysilicon.

6. A method of fabricating a NROM (Nitride ROM) device, comprising the steps of:

forming a first silicon oxide layer, a trapping layer, and a second silicon oxide layer on a substrate;

forming a gate pattern on the second silicon oxide layer;

performing an ion implantation process to form a buried bit-line in the substrate by using the gate pattern as a mask;

removing a portion of the gate pattern, the second silicon oxide layer and the trapping layer exposed by the gate pattern to increase a gap size of the gate pattern and to expose a portion of the first silicon oxide layer;

performing a pocket ion implantation process to form a pocket doped region at the periphery of the buried bit-line by using the gate pattern as a mask;

conducting a thermal process to form a buried bit-line oxide layer on the buried bit-line by using the trapping layer as a mask; and forming a word-line over the substrate.

7. The method of claim 6, wherein the method of removing a portion of the mask pattern comprises isotropic etching-back.

8. The method of claim 6, wherein the trapping layer comprises silicon nitride.

9. The method of claim 6, wherein the gate pattern comprises polysilicon.

10. The method of claim 6, wherein the word-line comprises polysilicon.

* * * * *